United States Patent
Reijs

(12) United States Patent (10) Patent No.: US 7,685,881 B2
Reijs (45) Date of Patent: Mar. 30, 2010

(54) SENSOR ELEMENT AND SENSOR ASSEMBLY PROVIDED WITH A CASING

(75) Inventor: Albertus Theodorus Johannes Reijs, Nijmegen (NL)

(73) Assignee: Elmos Advanced Packaging B.V., Nijmegen (NL)

( * ) Notice: Subject to any disclaimer, the term of this patent is extended or adjusted under 35 U.S.C. 154(b) by 0 days.

(21) Appl. No.: 12/056,585

(22) Filed: Mar. 27, 2008

(65) Prior Publication Data
US 2008/0236292 A1 Oct. 2, 2008

(30) Foreign Application Priority Data
Mar. 30, 2007 (NL) .................................... 2000566

(51) Int. Cl.
*G01L 9/06* (2006.01)
(52) U.S. Cl. ........................................... 73/727; 73/715
(58) Field of Classification Search ........... 73/700–756; 361/283.1–283.4
See application file for complete search history.

(56) References Cited

U.S. PATENT DOCUMENTS 3,387,494 A * 6/1968 Golay ......................... 73/705
4,841,777 A * 6/1989 Hershey et al. ................ 73/721
5,327,785 A * 7/1994 Maurer ......................... 73/756
5,394,751 A * 3/1995 Ishibashi ...................... 73/756
5,948,991 A * 9/1999 Nomura et al. ............... 73/727
5,986,316 A * 11/1999 Toyoda et al. ................ 257/419
6,401,545 B1 * 6/2002 Monk et al. ................... 73/756
6,550,339 B1 * 4/2003 Toyoda et al. ................. 73/716
6,907,789 B2 * 6/2005 Bodin .......................... 73/753
2003/0205091 A1 11/2003 Bodin

FOREIGN PATENT DOCUMENTS

| DE | 19843471 A1 | 5/1999 |
| DE | 102005053861 A1 | 5/2007 |
| WO | 0029822 | 5/2000 |
| WO | 2007017301 A1 | 2/2007 |

* cited by examiner

*Primary Examiner*—Lisa M Caputo
*Assistant Examiner*—Jermaine Jenkins
(74) *Attorney, Agent, or Firm*—The Webb Law Firm

(57) ABSTRACT

A sensor element having a sensitive sensor portion on an upper side of a substrate layer. The upper side of the substrate layer is provided with a recess on the periphery of the sensitive sensor portion. The recess provides mechanical isolation or decoupling of the sensitive sensor portion, as a result of which external forces do not cause stress in the sensitive sensor portion. In addition, a sensor assembly is described which is provided with at least one sensor element and a casing.

11 Claims, 5 Drawing Sheets

SENSOR ELEMENT AND SENSOR ASSEMBLY PROVIDED WITH A CASING

FIELD OF THE INVENTION

The present invention relates to a sensor element having a sensitive sensor portion on an upper side of a substrate layer. In a further aspect, the present invention relates to a sensor assembly provided with at least one sensor element and a casing, in which the casing is provided with an opening for an exposed sensor portion of the sensor element, for example a pressure sensor.

PRIOR ART

Such a sensor element and sensor assembly are known from patent publication WO2007/017301. Said publication shows a pressure sensor having a membrane underneath which a cavity is created. The drawback of such sensor elements and sensor assemblies is that they are sensitive to various kinds of stresses from the outside which are transmitted to the sensitive element in the sensor, for example when producing and curing the sensor casing. These stresses cause errors and variations in the measurement signal of the sensor.

SUMMARY OF THE INVENTION

It is an object of the present invention to provide a sensor element which is less sensitive to stresses and forces from the outside.

According to the present invention, a sensor element of the kind defined in the preamble is provided, in which the upper side of the substrate layer is provided with a recess on the periphery of the sensitive sensor portion. As a result of the recess in the upper surface of the substrate layer, the sensitive sensor portion is (in each case partially) mechanically isolated. Thus, stresses which are exerted on the substrate layer are not transmitted to the sensitive sensor portion.

In one embodiment, the recess overall extends over at least three quarters of the periphery of the sensitive sensor portion on the upper side. The recess may, for example, be in the shape of three or four straight adjoining grooves, or a circular groove over more than 270° around the sensitive sensor portion. This may already lead to a sufficient degree of mechanical isolation or decoupling of the sensitive sensor portion.

In a further embodiment, the sensitive sensor portion comprises a membrane, for example in order to form a pressure sensor of silicon material. Due to the flat shape of such a membrane, the latter is very sensitive to outside stresses (flexural and tensile forces).

In a further embodiment, a cavity is provided underneath the membrane in the substrate layer. If said cavity is closed off by a second substrate layer, a hermetically sealed chamber is formed, as a result of which the sensor element can measure an absolute pressure. If the cavity is not closed off, the sensor element can measure a relative pressure.

In yet a further embodiment, a third substrate layer is provided on the bottom side of the second substrate layer, the recess extends up to the bottom side of the second substrate layer, and the second substrate layer is bonded to the third substrate layer in the area outside the recess. Thus, a clapper-like body is formed with a sensitive sensor portion inside, which can move relatively freely with respect to the third substrate layer.

In one embodiment of the present invention, the recess is interrupted by at least one bridge part. This makes it possible to provide electrical connections between the sensitive sensor portion and connection regions on the substrate surface, for example in the form of metal conductors.

In a further embodiment, the bridge part comprises two (or more) parts located opposite one another. This results in a more stable construction of the suspension of the sensitive sensor portion. In this manner, it is also possible to convert a force which is exerted in opposite directions on both parts (for example by pressure on either side of the sensor) into a rotation of the sensitive sensor portion, without transmitting stresses to the sensitive sensor portion. In order to increase this effect, the bridge part forms an angle with the recess (in the plane of the substrate layer) in a further embodiment.

In a further embodiment, the recess has a depth in a direction at right angles to the upper side of the substrate layer which is greater than the thickness of the sensitive sensor portion. In the case of a thin membrane, this may be for example 10 µm or even less. In other cases, the recess can extend in the entire substrate layer.

In a further aspect, the present invention relates to a sensor assembly of the above-described kind, in which the casing is furthermore provided with a recess on the periphery of the opening. In a similar manner to the above-described embodiments of the sensor element, said recess results in a mechanical decoupling of the sensitive sensor portion, as a result of which the sensor overall is less sensitive to stresses and forces from the outside. In one embodiment, the entire recess surrounds at least three quarters of the periphery of the opening. The recess can again be formed, for example, as three or four straight adjoining grooves or a circular groove over more than 270° around the opening.

In one embodiment, the sensor element is placed on a support (or lead frame), and the recess extends as far as the support. In addition, the recess may be provided on both sides of the support. In each case, an improvement of the mechanical isolation or decoupling is achieved.

In yet a further embodiment, the exposed sensor portion of the sensor element is covered with a protective material, for example a gel. Such a protective material does not impede the primary function of the sensitive sensor portion (measuring pressure), but does provide protection and, as a result, improves the service life of the sensor.

SHORT DESCRIPTION OF THE DRAWINGS

The present invention will now be discussed in more detail by means of a number of exemplary embodiments, with reference to the attached drawings, in which.

DETAILED DESCRIPTION OF EXEMPLARY EMBODIMENTS

Figure 1:
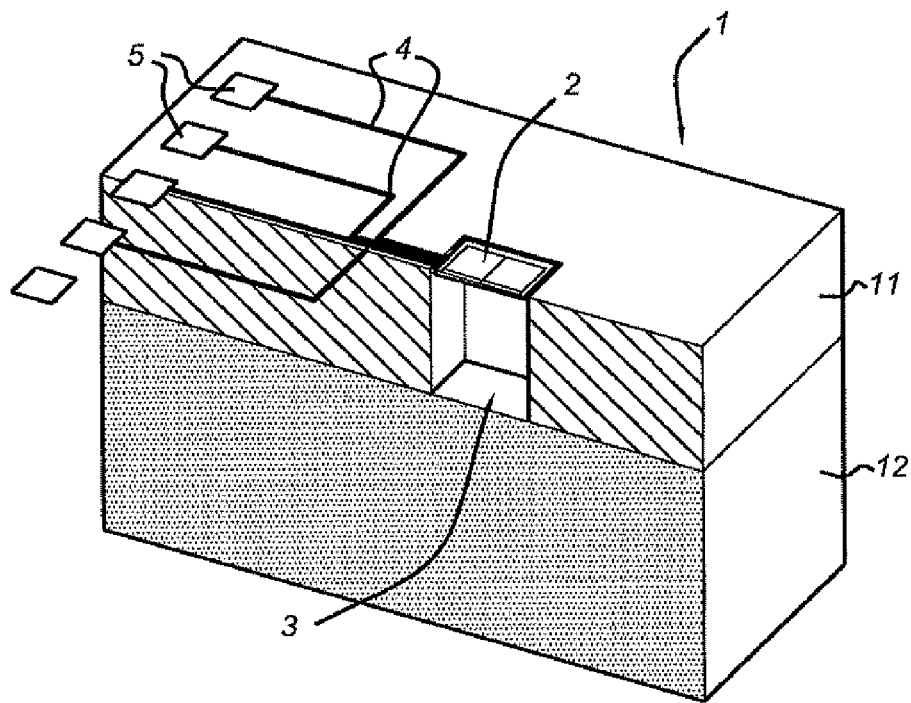
FIG. 1 shows a cross-sectional view in perspective of a prior-art sensor element.

FIG. 1 shows a cross-sectional view in perspective of a (semiconductor) sensor element 1 which is produced according to known techniques. The sensor element 1 is composed of a first (active) substrate layer 11, for example made of semiconductor material, in which conductive tracks 4 are provided on the upper side of the first substrate layer 11, which electrically connect a sensitive sensor portion 2 to connection regions 5. During the manufacturing process of an entire chip, lead wires are wire-stitched, welded or soldered onto the connection regions 5. In the illustrated embodiment, the sensitive sensor portion 2 is a membrane on top of a cavity or chamber 3. The membrane 2 is, for example, provided with a number of strain gauges in a Wheatstone bridge configuration, resulting in a pressure sensor. In the illustrated embodiment, the cavity 3 is closed off by a second substrate layer 12, which is hermetically connected to the first substrate layer 11. This makes the sensor element 1 suitable for absolute pressure measurement. If the second substrate layer 12 is not present, a relative pressure sensor 1 is obtained.

Numerous outside influences exert forces on the sensitive portion 2 of the sensor element 1, which are disadvantageous for a reliable and accurate operation (stability, accuracy). Consideration may be given to stresses which occur in the material of the first substrate layer 11 by, for example, the lead frame on which the sensor chip is mounted, bonding materials, the casing of the chip and the production thereof (stresses resulting from shrinking or, on the contrary, expansion). The stresses may be caused by forces, but also by bending or torsion.

Figure 2:
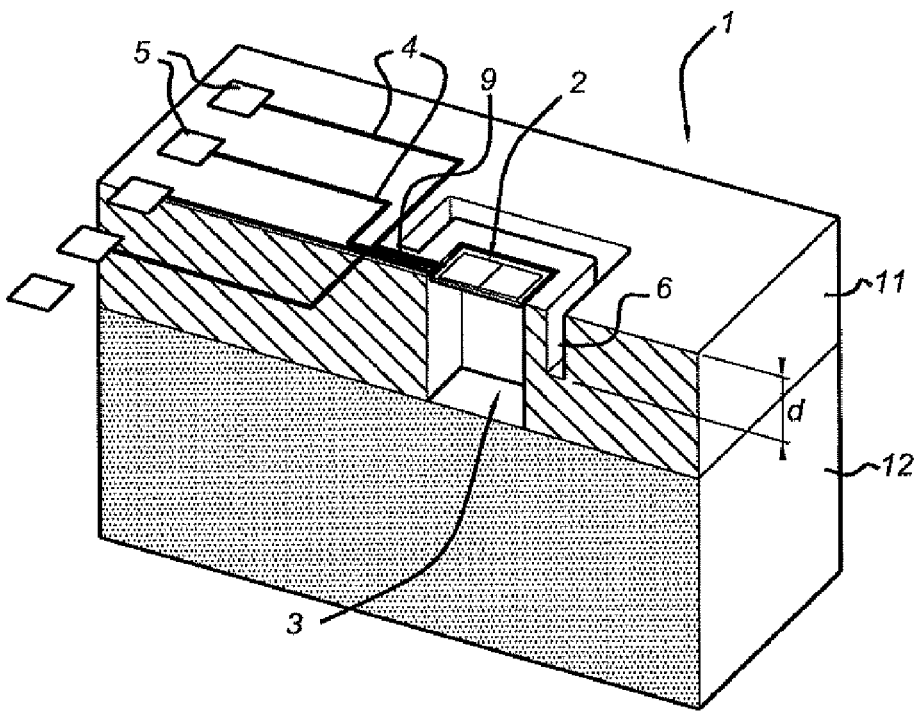
FIG. 2 shows a cross-sectional view in perspective of a sensor element according to an embodiment of the present invention.

These problems are solved by means of a sensor element according to one of the embodiments of the present invention. A first embodiment is illustrated in the partially cross-sectional view in perspective from FIG. 2. The structure of the sensor element 1 is largely identical to that of the sensor element which is illustrated in FIG. 1, with a recess 6 being provided at the periphery of the sensitive sensor portion 2 as an additional measure. In the illustrated embodiment, the recess 6 is a groove having a depth d (for example several micrometers) which is provided in the upper side of the first substrate layer 11, for example using an etching technique or a different material-removal technique, such as milling. The recess 6 is interrupted at one location by a bridge part 9, which makes it possible for the conductive tracks 4 of the sensitive sensor portion 2 to run to the connection regions 5. As a result of the recess 6, a top layer of the first substrate layer 11 will to a large degree be mechanically isolated from the rest of the first substrate layer 11 at the location of the sensitive sensor portion 2. Stresses (forces, flexures, torsions) acting on other parts of the sensor element 1 will (virtually) not be transmitted to the sensitive sensor portion 2.

The recess 6 is provided around the majority of the periphery of the sensitive sensor portion 2, for example overall around more than three quarters of the periphery. The shape of the recess 6 is shown as a combination of elongated grooves, but it will be clear that other shapes (polygonal, circular, oval) will also have the same effect.

The depth d of the recess 6 (which may also be provided in the shape of a groove, slot, notch, excavation, gap and the like) can be adapted to the specific application of the sensor element 1. It is possible to achieve a better mechanical decoupling when the recess has a greater depth d, for example across the entire thickness of the first substrate layer 11.

Figure 3:
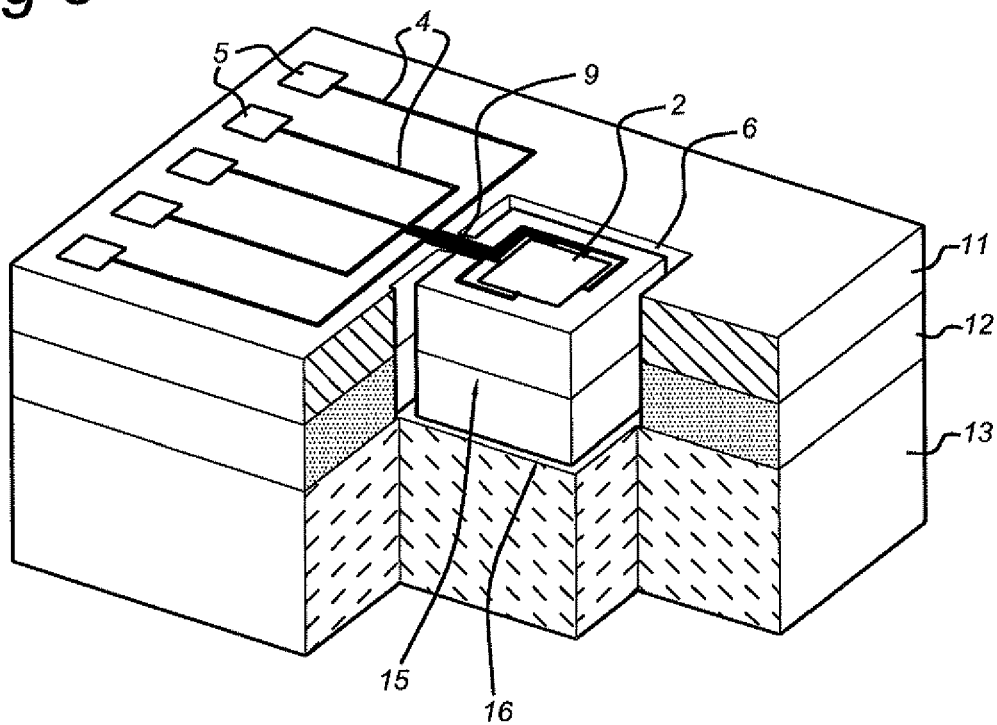
FIG. 3 shows a partially cross-sectional view in perspective of a sensor element according to a further embodiment of the present invention.
Figure 4:
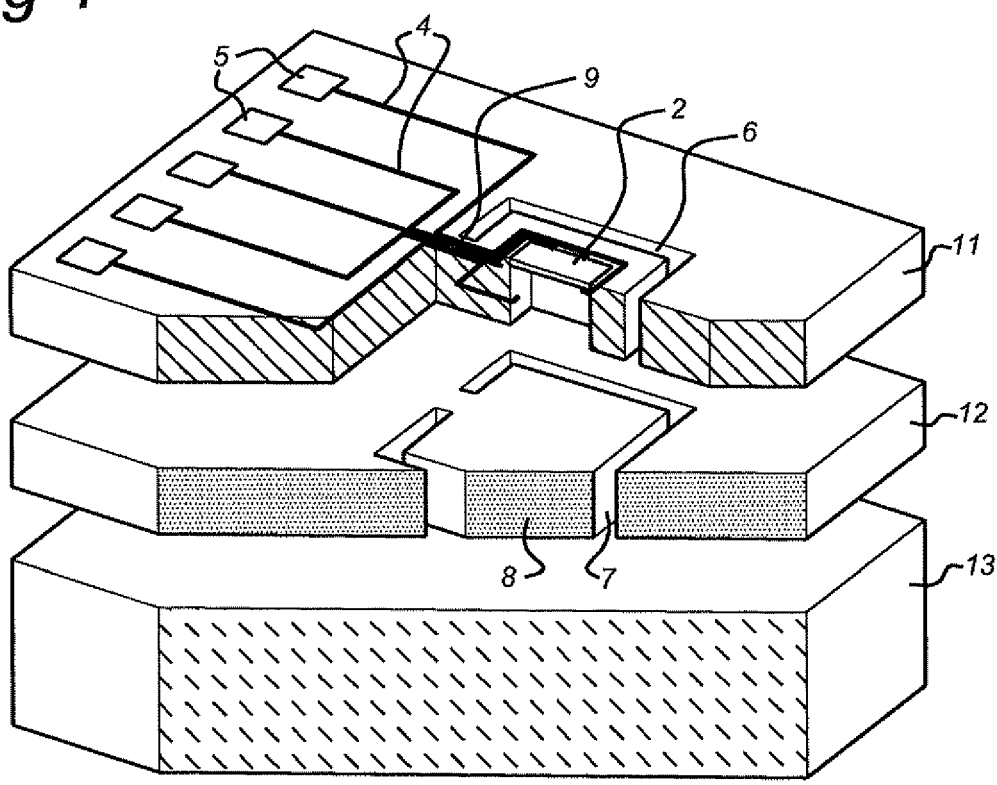
FIG. 4 shows an exploded view of the sensor element from FIG. 3.

A further embodiment is illustrated in the partially cross-sectional view in perspective from FIG. 3 and the cross-sectional view in perspective from FIG. 4 discussed above. In this sensor element 1, a third substrate layer 13 is provided which serves as a base for the sensor element 1. This makes it possible to continue the recess 6 in the first substrate layer 11 as a second recess 7 in the second substrate layer 12. As a result thereof, a sealing layer 8 is formed which hermetically seals the cavity 3 under the sensitive sensor portion 2 (for example for an absolute pressure sensor 1). The second substrate layer 12 is bonded to the third substrate layer 13 (hermetical joining layer 15), except for the sealing layer 8 (free faces 16). This results in a kind of clapper, delimited by the recess 6 and a second recess 7, which can move freely across the surface 16 of the third substrate layer 13 (but is obviously held in place by the bridge part 9). This has the advantage that various external forces, flexures or torsions in the assembly comprising first, second and third substrate layer 11-13 can be isolated in a very effective manner from the sensitive sensor portion 2. The free face 16 of the 'clapper' can bear on the surface of the third substrate layer 13, or be just clear. In the latter case, the surface forms an end stop for the loose face 16, as a result of which some movement of the clapper is possible.

Figure 5:
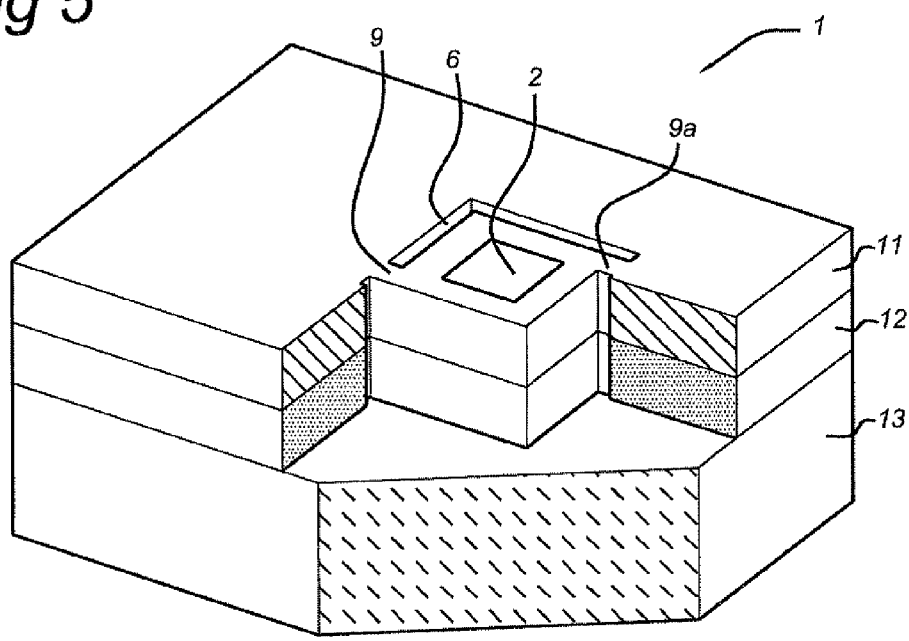
FIG. 5 shows a perspective top view in partial cross section of a further embodiment of the sensor element according to the present invention.

FIG. 5 shows a top view in partial cross section of an alternative embodiment, in which the recess 6 is interrupted at two locations by a bridge part 9, 9a. The bridge parts 9, 9a are positioned diametrically opposite the sensor portion 2. The result thereof is a more stable construction of the sensor element 1, and it is also possible to use a larger surface area for the conductor tracks 4. In addition, if a clapper construction is used as explained with reference to FIGS. 3 and 4, a force which is exerted on the semiconductor layers 11-13 is partially converted into a rotating movement, without the stress being transmitted to the sensitive sensor portion 2.

Figure 6:
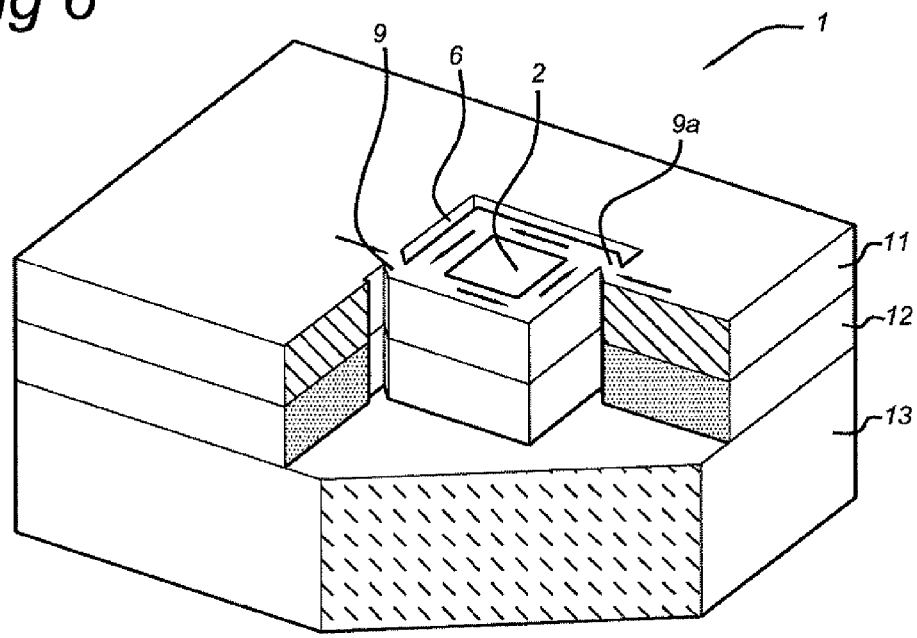
FIG. 6 shows a perspective top view in partial cross section of an alternative of the embodiment from FIG. 5.

FIG. 6 shows a top view in perspective of yet another alternative, in which the bridge parts 9, 9a are at an angle to the recess 6 designed as elongate slots. The result thereof is that a stress which is exerted on two sides of the sensor element 1 (indicated by the arrows at the bridge parts 9, 9a) causes a rotation of the sensitive sensor portion 2 (the clapper), but no stress in the sensitive sensor portion 2.

Figure 7:
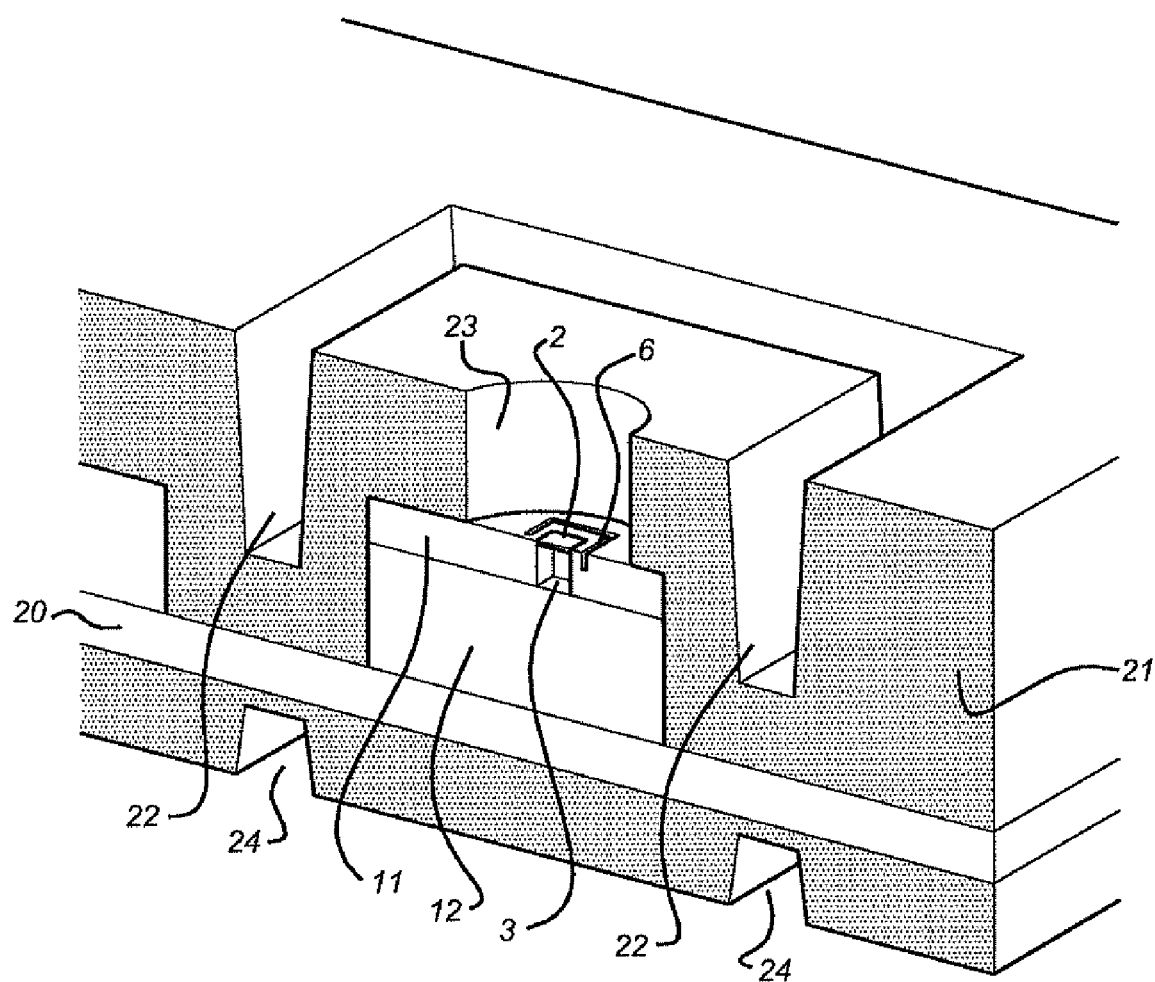
FIG. 7 shows a cross-sectional view in perspective of a sensor assembly according to an embodiment of the present invention.

According to the present invention, it is also possible to reduce stresses in a sensitive sensor portion 2 of a sensor element 1 by means of one or more recesses 22, 24 in a casing 21 of a sensor assembly. A first embodiment thereof is shown in the cross-sectional view in perspective in FIG. 7. A sensor element 1, in this case comprising a first and second substrate layer 11, 12, and provided with a sensitive sensor portion 2 above a closed-off cavity 3, is placed on a support 20 (a connection support or lead frame). This assembly is surrounded in a manner known per se by a casing 21 in order to protect the chip with sensor element 1. In order to ensure reliable functioning of the sensor element 1, an opening 23 is provided in the casing 21, as a result of which the sensitive portion 2 of the sensor element 1 is exposed to the environment. By means of a recess 22 in the casing 21, externally applied forces (through bending, torsion, etc.) are transmitted to a lesser degree to the sensor element 1 itself in particular to the sensitive sensor portion 2. In order to improve the effect, it is possible, as is illustrated in the embodiment from FIG. 7, to provide grooves or recesses 24 on the bottom side of the casing 21 as well.

Figure 8:
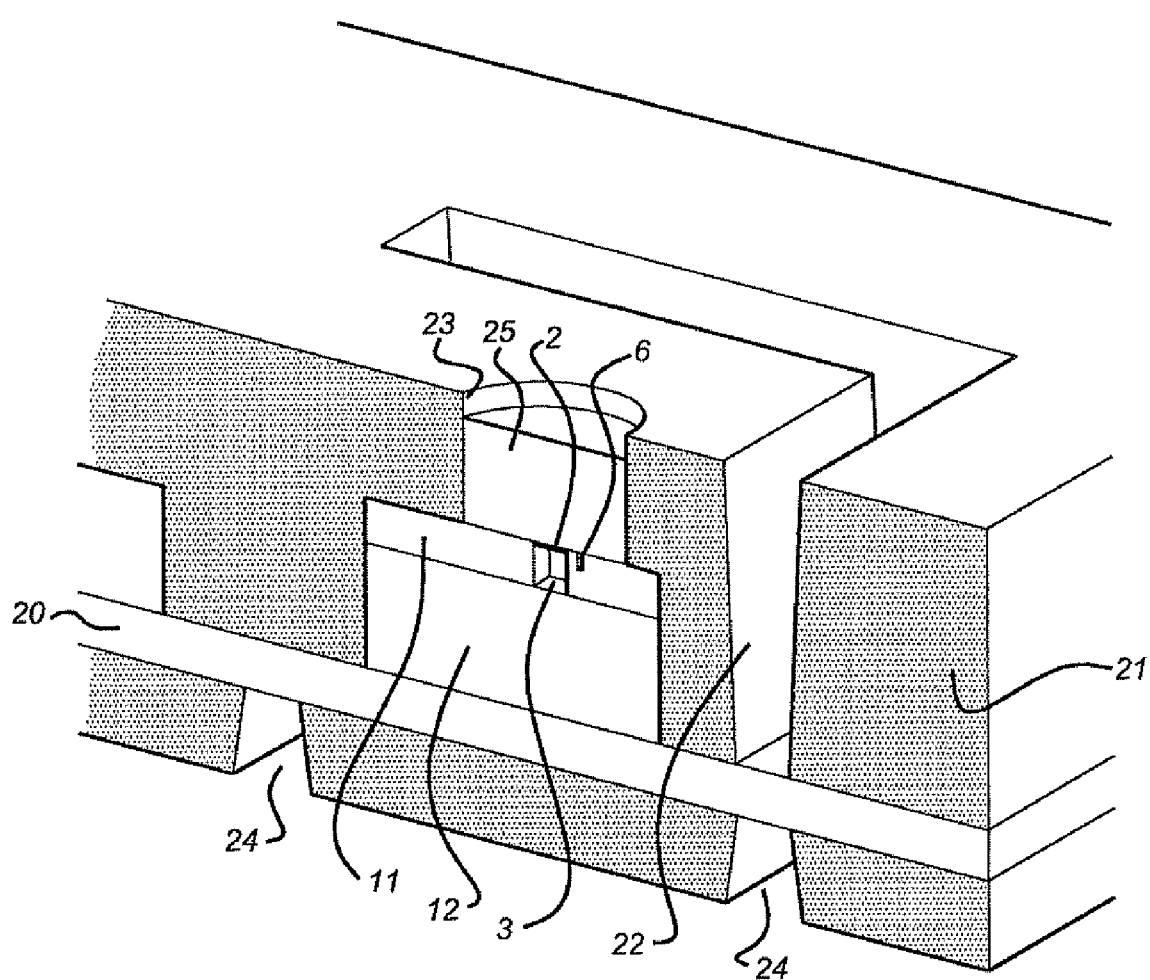
FIG. 8 shows a cross-sectional view in perspective of a further embodiment of the sensor assembly from FIG. 7.

FIG. 8 shows a cross-sectional view in perspective of a further embodiment, in which the recesses 22, 24 are deeper, and extend up to the lead frame 20. The effect of decoupling the sensitive sensor portion 2 from external forces thus becomes more effective. Furthermore, in this embodiment the recess 22 on the upper side of the casing 21 is only provided over a part of the periphery around the opening 23. This is particularly advantageous if possible external influences are known beforehand (which, for example, always occur in one direction), or if, for example, two adjacent sensors 1 are placed in the same casing 21.

It will be clear that the sensor element 1 which is used in the sensor assembly according to these embodiments may optionally be provided with a recess 6 as described above.

Furthermore, the embodiment in FIG. 8 shows that the opening 23 is filled with a protective material 25, for example a gel or a mesh. This protects the sensitive sensor portion 2 against external influences, while the reliable functioning (for example as a pressure sensor) is not affected. The gel 25 may also be provided in the recesses 22, 24 so that the latter cannot become blocked by dirt or the like, and the stress decoupling function is maintained for a relatively long period of time.

It will be clear for someone skilled in the art that modifications and alterations to the illustrated embodiments are possible and are covered by the scope of protection of this invention, which is defined by the attached claims. Thus, for example, the illustrated rectangular shape of the recesses 6, 22, 24 can be changed to a polygonal shape, a circular shape, an oval shape, etc. without reducing the effect.

The invention claimed is:

1. A sensor element comprising a sensitive sensor portion on an upper side of a substrate layer, wherein:
the upper side of the substrate layer is provided with a recess on a periphery of the sensitive sensor portion;
the sensitive sensor portion comprises a membrane;
a cavity is provided underneath the membrane in the substrate layer;
the cavity is closed off by a second substrate layer; and
a third substrate layer is provided on the bottom side of the second substrate layer, the recess extends up to the bottom side of the second substrate layer, and the second substrate layer is bonded to the third substrate layer in an area outside the recess.

2. The sensor element as claimed in claim 1, wherein the recess extends over at least three quarters of the periphery of the sensitive sensor portion on the upper side.

3. The sensor element as claimed in claim 1, wherein the recess is interrupted by at least one bridge part.

4. The sensor element as claimed in claim 3, wherein the bridge part comprises two parts located opposite one another.

5. The sensor element as claimed in claim 3, wherein the bridge part forms an angle with the recess.

6. The sensor element as claimed in claim 1, wherein the recess has a depth in a direction at right angles to the upper side of the substrate layer which is greater than a thickness of the sensitive sensor portion.

7. A sensor assembly comprising:
at least one sensor element disposed on an upper side of a substrate layer; and
a casing surrounding the at least one sensor element, wherein:
the casing is provided with an opening for an exposed sensor portion of the sensor element;
the casing is further provided with a recess on a periphery of the opening;
the sensor portion comprises a membrane;
a cavity is provided underneath the membrane in the substrate layer;
the cavity is closed off by a second substrate layer; and
a third substrate layer is provided on the bottom side of the second substrate layer, the recess extends up to the top side of the third substrate layer, and the second substrate layer is bonded to the third substrate layer in an area outside the recess.

8. The sensor assembly as claimed in claim 7, wherein the recess extends over at least three quarters of the periphery of the opening.

9. The sensor assembly as claimed in claim 7, wherein the third substrate layer is a lead frame.

10. The sensor assembly as claimed in claim 9, wherein the recess is provided on both sides of the lead frame.

11. The sensor assembly as claimed in claim 7, wherein the exposed sensor portion of the sensor element is covered with a protective material.

* * * * *